United States Patent [19]

Takahama et al.

[11] 3,930,896

[45] Jan. 6, 1976

[54] METHOD FOR PRODUCING METAL FILM RESISTOR BY ELECTROLESS PLATING

[75] Inventors: Hiroshi Takahama, Higashi-Osaka; Hachiro Hamaguchi, Nara, both of Japan

[73] Assignee: Tatsuta Densen Kabushiki Kaisha, Japan

[22] Filed: May 17, 1974

[21] Appl. No.: 471,140

[30] Foreign Application Priority Data

May 18, 1973 Japan.............................. 48-56614

[52] U.S. Cl...................... 148/6.3; 106/1; 252/514; 427/103; 427/101; 427/123; 427/305
[51] Int. Cl.²...................... C23C 19/00; B05D 5/12
[58] Field of Search........... 117/227, 213, 47 R, 62, 117/118; 106/1; 252/514; 148/6.3; 427/101, 103, 123, 305

[56] References Cited
UNITED STATES PATENTS

| | | |
|---|---|---|
| 3,105,772 | 10/1963 | Loiseieur .................. 106/1 |
| 3,134,690 | 5/1964 | Eriksson ................. 117/227 X |
| 3,432,338 | 3/1969 | Sickles..................... 106/1 |
| 3,586,839 | 1/1971 | Roy........................ 106/1 X |
| 3,597,266 | 8/1971 | Lelhowitz ................ 106/1 X |
| 3,698,919 | 10/1972 | Kuzmik................... 106/1 |
| 3,778,300 | 12/1973 | Wohlberg ................ 117/118 |
| 3,846,015 | 12/1970 | Vulliez et al............. 117/118 X |

*Primary Examiner*—Mayer Weinblatt
*Attorney, Agent, or Firm*—Wenderoth, Lind & Ponack

[57] ABSTRACT

Method for producing a metal film resistor by (1) treating a base material with a stannous chloride solution, silver salt solution and palladium chloride solution, respectively, (2) subjecting the thus treated base material to electroless plating in a bath having a pH of 9.5–10.5 containing specified amounts of cobalt salts, nickel salts, sodium hypophosphite and specific acetifying agents, at a temperature of 20°–50°C, (3) heat treating the resultant metal film under specified conditions, which are also effective to prevent oxidation of the film and (4) subjecting the heattreated metal film to a surface treatment under specified conditions, which are also effective to cause oxidation of the film.

5 Claims, No Drawings

METHOD FOR PRODUCING METAL FILM RESISTOR BY ELECTROLESS PLATING

This invention relates to a method for producing an excellent metal film resistor by electroless plating.

Only a few methods for producing a metal film resistor have hitherto been made public. For example, *British Communication and Electronics*, Vol. 12, No. 6, 1965, pgs. 372–74 discloses a test on a resistor of maximum resistance value of 360 K$\Omega$.

However, all the known electroless plating methods involve difficulties in producing a metal film resistor of excellent properties with reliability, as a result of which no method for producing a metal film resistor by electroless plating has been put to practical use.

This invention has enabled mass production of practical metal film resistors having well-balanced resistance properties by electroless plating as a result of comprehensive research concerning the metal educing speed from electroless plating bath, the type and concentration of metal ions, determining the adhesion of the educed metal film to the base material, and the stability of the electroless plating bath, the type and concentration of reducing agents, the type and concentration of acetifying agents, the pH values and type of pH adjusting agents, the temperature of the plating bath, the effect of mutual reactions of the foregoing factors, as well as pretreatment prior to electroless plating and heat treatment of the educed metal film. The construction of this invention will hereinunder be described in detail.

In the conventional pretreatment and electroless plating method for producing a metal film resistor, a base material (glass, ceramic or the like) is caused to absorb tin by making use of a stannous chloride solution in a sensitizing process, the resultant base material is washed, then a pretreatment is carried out for activation by applying palladium from a palladium chloride solution, followed by washing, and thereafter the metal film is formed by electroless plating.

However, it has been impossible to obtain a stabilized metal film resistor of excellent properties by the conventional method, though various types of electroless plating baths have been introduced with the object of overcoming these difficulties. As a result of a systematic study on the defects of the conventional method, it has been found that during the washing process, after absorption of stannous ions, or palladium ions in the pretreatment, the absorbed tin or palladium is detached from the base material with the result that the activated film loses its uniformity. In the case of electroless plating not intended for the production of a resistor, a thick plating is preferred, and therefore unevenness of the activated film or the like has little effect on the properties of the finished product. In the case of production of a resistor, however, an extremely thin and uniform film is required, and thus unevenness of the activated film poses a very serious problem.

In view of the foregoing, the pretreatment of this invention has for its object to obtain an activated film which does not become detached from the base material during washing or the like. The pretreatment of this invention is characterized in that, prior to the conventional pretreatment, in which the sensitized and washed base material (sensitized by soaking it in a stannous chloride solution, followed by washing) is activated by soaking it in a palladium chloride solution, the base material, washed after treatment in a stannous chloride solution, is treated with a silver solution as an additional process step.

The process will be explained in detail by reference to an embodiment of the invention.

Thus, the sensitizing solution is a solution comprising stannous chloride and hydrochloric acid, for example, a solution prepared by adding 5g stannous chloride and 10cc hydrochloric acid to 1 liter of water.

The silver solution is prepared by making use of silver salts, such as silver nitrate ($AgNO_3$), silver chloride and the like, for example, a solution prepared by dissolving 5g silver nitrate in 1 liter of water and adding a small amount, e.g. 0.5-1g, of ammonia water thereto.

The activating solution is a solution comprising palladium chloride and hydrochloric acid, for example, a solution prepared by dissolving 5g palladium chloride in 5cc hydrochloric acid by heating, the resultant liquid being diluted by adding 0.2cc thereof to 1 liter of water.

It is desirous that the temperature of each of these solutions be adjusted to within the range of 15°C–50°C.

One to 10 minutes is sufficient for each of the treatments with the indicated solutions.

Thus, a stabilized and uniform activated film is formed on the base material, said film being undetachable during washing or the like, thereby enabling production of an extremely uniform film for application of electroless plating thereto.

The electroless plating bath will be explained hereinunder.

1 The amount of cobalt ion within 1 liter of the plating bath is 0.016 – 0.038 mol, the ratio of the cobalt ion to nickel ion being 6:1 – 15:1.

2 The amount of sodium hypophosphite used as a reducing agent should be 0.28 – 0.47 mol.

3 As an acetifying agent, 0.34 – 0.75 mol of sodium citrate may be added to the bath. Alternatively, one or more of the following may be used as an acetifying agent: 0.34 – 0.75 mol of sodium citrate, 0.04 – 0.22 mol of sodium tartrate and 0.05 – 0.16 mol of sodium malate.

4 The pH of the bath should be maintained at 9.5 – 10.5 by the addition of ammonium hydroxide.

5 The plating process should be conducted within a temperature range of 20°C – 50°C.

It is to be understood that production of a resistor of excellent properties in accordance with this invention is rendered impossible if the plating bath composition and pH, and the plating temperature, do not satisfy the above requirements.

The fundamental reason for regulating the composition of the plating bath, the plating temperature and the pH with regard to the electroless plating method of this invention is that such regulation enables control of the educing speed of metal ions so as to obtain uniform and stabilized eduction thereof and a metal film of excellent properties.

To be more precise, the reason for restricting the amount of cobalt and nickel ions is that the cobalt ion, which is slow in plating speed, will not be educed if used in an amount below 0.016 mol. On the other hand, if the cobalt ion is used in an amount greater than 0.038 mol, cobalt ion deposit is produced in large quantities in the bath, thereby impeding the plating reaction.

The amount of nickel ion should not be greater than 1/6 the amount of cobalt ion, further addition being unadvisable since the nickel ion has a greater plating speed and is educed precipitously.

The addition of sodium hypophosphite as a reducing agent should be in an amount of 0.28 – 0.47 mol since the reducing power of the metal ion is weak if below the minimum amount, resulting in only partial plating. On the other hand, addition exceeding the maximum amount is also unadvisable since it will cause spontaneous decomposition of the plating bath.

As an acetifying agent, sodium citrate in an amount of 0.34 – 0.75 mol should be added to the bath, or one or more of 0.34 – 0.75 mol sodium citrate, 0.04 – 0.22 mol sodium tartrate and 0.05 – 0.16 mol sodium malate should be added to the bath. Production of a resistor film fit for use as a resistor becomes difficult when such requirements for the acetifying agent are not satisfied. Particularly, in the case of addition of more than one acetifying agent, the acetifying effect is intensified, thereby enabling prolonging the life of the plating bath.

Furthermore, in case the pH of the bath is less than 9.5, a proper plating reaction is impossible, even when the plating bath composition is otherwise within the scope of the prerequisites described above. Though the plating reaction is more or less accelerated if the pH is more than 10.5, alkalinity above 10.5 is unnecessary to obtain a resistor preferred in this invention.

With regard to the plating temperature, a low temperature of 20°C – 50°C is suitable to obtain a resistor preferred in this invention. If below 20°C, the plating speed is excessively low with the result that the surface of a ceramic rod on which an activated film is produced by said pretreatment is only partially plated. If above 50°C, the plating speed is accelerated but the plated film is thick and the metal particles are rough with the result that formation of a uniform film, particularly desirable for a resistor, becomes impossible.

Consequently, for the eduction of a resistor film as a resistor for truly practical use, it is most essential to strictly regulate the type and concentration of the metal ions, the type and concentration of reducing agents, the type and concentration of acetifying agents, the pH value and type of pH adjusting agents, and the temperature of the plating bath.

In the electroless plating bath according to this invention, there is a close relation between all the conditions above prescribed, that is, the amount of cobalt ion and of nickel ion, as well as the ratio thereof, the amount of sodium hypophosphite as a reducing agent, the amount of sodium citrate as an acetifying agent, the respective amounts of sodium citrate, sodium tartrate and sodium malate, the pH, and the plating temperature. The multiplied effect of these conditions enables production of a metal film resistor of excellent properties, mass production of which has hitherto been impossible. By maintaining the plating bath in accordance with said conditions at temperatures within those described, and by immersing in this plating bath a ceramic rod having an activated film subjected to the pretreatment of this invention, a uniform film of excellent resisting properties can be formed on the surface of the ceramic rod, that is, the resistor of this invention can be produced.

Table 1 shows the composition of the electroless plating bath according to this invention.

TABLE 1

| Additive Agent, pH, Treatment Temperature, Resistance Value of Finished Product | Plating Bath 1 | 2 | 3 | 4 |
|---|---|---|---|---|
| Cobalt sulfate (Amount of cobalt ion:mol) | 0.016–0.038 | 0.016–0.038 | 0.016–0.038 | 0.016–0.038 |
| Nickel sulfate (Cobalt ion : mol ratio Nickel ion) | 6/1 | 10/1 | 10/1 | 15/1 |
| Sodium hypophosphite (g/l) | 30–50 | 30–50 | 30–50 | 30–50 |
| Sodium citrate (g/l) | 100–220 | 100–220 | 100–220 | 100–220 |
| Sodium tartrate (g/l) | 10–50 | 10–50 | 0 | 10–50 |
| Sodium malate (g/l) | 10–30 | 10–30 | 0 | 10–30 |
| pH | 9.5–10.5 | 9.5–10.5 | 9.5–10.5 | 9.5–10.5 |
| Treatment Temperature (C°) | 20–50 | 20–50 | 20–50 | 20–50 |
| Resistance Value of Finished Product (KΩ) | Low resistance-1.200 | Low resistance-1.800 | Low resistance-4.000 | Low resistance-2.500 |
| Film Thickness (μ) | 0.05–1 | 0.05–1 | 0.05–1 | 0.05–1 |

Furthermore, in order to obtain the best properties possible for the resistor, it is necessary to subject the resistor film to a heat treatment and surface treatment, as follows:

1 The resistor film educed on the base material, such as a ceramic rod, a glass rod or the like, by means of the pretreatment and the electroless plating bath, is heat-treated in an atmosphere in which the metal film is substantially prevented from oxidizing during heating, preferably in a vacuum or inert gas under a pressure below 10 mm Hg, at temperatures above 230°C under the condition of $K \times T \geq 1,000$ (°C, hr), wherein K is the temperature in °C, and T the time in hours, of the treatment.

2 Then, the resistor film is surface-treated in an atmosphere in which the metal film is oxidized during heating, preferably in air under a pressure above 10 mm Hg, at temperatures exceeding 150°C under the condition of $K \times T \geq 200$ (°C, hr), wherein K is the temperature in °C, and T the time in hours, of the treatment, thereby enabling improvement not only in the balance of various properties, such as the temperature property, pulse property, load life, moisture resisting load life and the like, but also in the absolute values of the respective properties as well.

With regard to the heat treatment of this invention, the reason the resistor film should be treated in conformity with the foregoing conditions is as follows:

The Ni-Co resistor film should be heat-treated, as specified above in (1), in an atmosphere in which the metal film is not oxidized during heating, preferably in a vacuum or inert gas under a pressure below 10 mm Hg, at temperatures above 230°C and under the condition of $K \times T \geq 1,000$ (°C, hr), because this is the best heat treatment for the Ni-Co resistor film whereby the temperature property, pulse property and load property thereof can be improved up to values which are satisfactory. Heat treatment outside the scope of these conditions is unadvisable because variation of the resistance properties relative to variation of temperatures becomes greater.

Furthermore, as described in (2) above, the resistor film is surface-treated in an atmosphere in which the metal film is oxidized during heating, preferably in air under a pressure above 10 mm Hg, at temperatures above 150°C under the condition of $K \times T \geq 200$ (°C, hr), thereby enabling formation of an extremely thin protective film on the surface of the resistor film after heat treatment, whereby the load property, moisture resisting load property and the like are improved. If the product of the surface treatment temperature (°C) and the treatment time (hr) is less than 200, formation of the protective film is unsatisfactory, with the result that oxidation and other undesirable chemical changes are liable to occur in the resistor film when subjected for a long period of time to a thermal or humid atmosphere.

The heat treatment and the surface treatment are indispensable in this invention, in which the important properties required for the resistor member, such as temperature property, pulse property, load property, moisture resisting load property and the like, are maintained in equilibrium along with improvement of the absolute values of such properties. A desirable resistor member is unobtainable in case either the heat treatment or the surface treatment of the resistor film is omitted, or the order of these treatments is reversed.

Table 2 shows the results of a test conducted to determine the effects of this invention.

TABLE 2

| Sample | Heat Treatment Atmosphere | K; K×T | Surface Treatment Atmosphere | K; K×T | Remarks |
|---|---|---|---|---|---|
| Ni-Co resistor member of film thickness below 0.05 μ | In air or inert gas of pressure below 10 mm Hg | K>230 K×T ≧ 1000 | In air of pressure above 10 mm Hg | K>150 K×T ≧ 200 | Stabilized Resistor unobtainable due to excessively thin film |
| Ni-Co resistor member of film thickness 0.05 - 1.0μ | " | " | " | " | Satisfactory |
| Ni-Co resistor member of film thickness above 1.0μ | " | " | " | " | Resistor of low resistance obtainable |
| Ni-Co resistor member of film thickness 0.05 - 1.0 μ | " | K>230 K×T<1000 | " | " | Stabilized resistor unobtainable due to insufficient heat treatment |
| " | " | K<230 K×T ≧ 1000 | " | " | " |
| Ni-Co resistor member of film thickness 0.05 - 1.0μ | " | K>230 K×T ≧ 1000 | " | K<150 K×T ≧ 200 | Stabilized resistor unobtainable due to poor moisture and heat resistance resulting from insufficient surface treatment |
| " | " | " | " | K>150 K×T<200 | " |

Since it is necessary to stabilize the resistor film without oxidizing it during the heat treatment, the pressure of the heat treatment atmosphere should be below 10 mm Hg.

Tables 3, 4, 5 and 6 show the results of comparative tests on a resistor produced by the known plating pretreatment, electroless plating bath and heat treatment, and a resistor produced by applying the heat treatment of this invention to a metal film educed as a result of the pretreatment and the electroless plating bath according to this invention.

TABLE 3

| Short-Term Overload Test Resistor According to Method of this Invention | | Test Method JIS.C. 6407 Resistor According to Known Method | |
|---|---|---|---|
| Resistance Value of Finished Product (KΩ) | Variation Rate (%) | Resistance Value of Finished Product (KΩ) | Variation Rate (%) |
| 99.9 | +0.06 | 101.8 | +288 |
| 100.1 | +0.03 | 99.9 | — |

TABLE 3-continued

Short-Term Overload Test     Test Method JIS.C. 6407

| Resistor According to Method of this Invention | | Resistor According to Known Method | |
|---|---|---|---|
| Resistance Value of Finished Product (KΩ) | Variation Rate (%) | Resistance Value of Finished Product (KΩ) | Variation Rate (%) |
| 100.1 | +0.02 | 102.4 | — |
| 99.6 | +0.01 | 101.4 | +20.90 |
| 98.5 | +0.01 | 100.4 | +50.00 |

TABLE 4

Pulse Test     Test Method 1800 V Impulse

| Resistor According to Method of This Invention | | Resistor According to Known Method | |
|---|---|---|---|
| Resistance Value of Finished Product (KΩ) | Variation Rate (%) | Resistance Value of Finished Product (KΩ) | Variation Rate (%) |
| 263.7 | −0.04 | 256.2 | Burnt |
| 263.2 | −0.05 | 256.1 | — |
| 266.5 | −0.07 | 242.1 | — |
| 264.3 | −0.08 | 260.3 | — |
| 263.2 | −0.05 | 265.3 | — |

TABLE 5

Load Life Test     Test Method MIL.R. 22604

| Resistor According to Method of This Invention | | Resistor According to Known Method | |
|---|---|---|---|
| Resistance Value of Finished Product (KΩ) | Variation Rate (%) | Resistance Value of Finished Product (KΩ) | Variation Rate (%) |
| 980.6 | +0.30 | 965.0 | ∞ |
| 1006.6 | 0 | 985.4 | ∞ |
| 976.7 | +0.20 | 1000.1 | +47.20 |
| 982.4 | +0.20 | 993.4 | ∞ |
| 990.2 | +0.10 | 981.0 | +39.40 |

TABLE 6

Resistance Temperature Coefficient Test     Test Method JIS.C. 6404

| Resistor According to Method of This Invention | | Resistor According to Known Method | |
|---|---|---|---|
| Resistance Value of Finished Product (KΩ) | Variation Rate (%) | Resistance Value of Finished Product (KΩ) | Variation Rate (%) |
| 502.8 | +33 | 504.2 | +114 |
| 500.5 | +11 | 499.0 | +121 |
| 502.6 | +34 | 501.1 | +117 |
| 503.2 | +36 | 502.5 | +115 |
| 502.1 | +6 | 503.0 | +117 |

TABLE 7

(Table shows aggregation of the comparative data of the properties described hereinbefore.)

| Metal Film Resistor | Measurement Value | Resistance per Area (KΩ/Sq) | Resistance Value of Finished Product (KΩ) | Short-Term Overload Test Resistance Value Variation Rate Under Load of 2.5 Times Voltage of Normal Power (%) | Short-Term Overload Test Resistance Value Variation Rate Under Load of 3.5 Times Voltage of Normal Power (%) | Temperature Coefficient (PPM/°C) | Pulse Test 10000 Times |
|---|---|---|---|---|---|---|---|
| Resistor Produced by Known Electroless Plating Method | | 0.1 – 0.3 | 300 | ±0.11 | ±0.14 | ±85 | Burnt |
| | | 0.5 – 1.0 | 750 | Burnt | Burnt | ±70 | Burnt |
| | | 1.0 – 2.0 | 1500 | Burnt | Burnt | ±120 | Burnt |
| | | 5.0 – 10.0 | 4000 | Burnt | Burnt | ±140 | Burnt |
| Resistor Produced by Electroless Plating Method of This invention | | 0.1 – 0.3 | 300 | ±0.04 | ±0.08 | ±20 | ±0.01 |
| | | 0.5 – 1.0 | 750 | ±0.08 | ±0.10 | ±30 | ±0.01 |
| | | 1.0 – 2.0 | 1500 | ±0.12 | ±0.06 | ±40 | ±0.03 |
| | | 5.0 – 10.0 | 4000 | ±0.10 | ±0.09 | ±50 | ±0.15 |

The stabilized metal film resistor of this invention produced under the foregoing conditions is a product capable of sufficiently satisfying the values stipulated by MIL-R (10509 F), as shown in Table 8 below.

TABLE 9

| Measured Value | Testing Item Temp. Property (PPM) | Pulse Property (%) | Load Life (%) | Moisture Resisting Load Life (%) |
|---|---|---|---|---|
| Value Stipulated by MIL-R(10509F) | ±50 | Reference | Below 0.50% | Reference |
| Value of Resistor of this Invention (Mean value) | 0 – 36 | 0 – 0.07 | 0.02 – 0.06 | 0 – 0.06 |

What we claim is:

1. A method for producing a nickel-cobalt alloy film for use as a resistor, which comprises immersing a ceramic or glass base material in a stannous chloride solution, a silver salt solution and a palladium chloride solution, respectively, subjecting the thus treated base material to electroless plating in a bath containing 0.016 – 0.038 mol of cobalt ions, nickel ions in an amount to provide a molar ratio of cobalt ions to nickel ions of 6:1 to 15:1, 0.28 – 0.47 mol of sodium hypophosphite and 0.34 – 0.75 mol of sodium citrate, all bath component amounts being based on one liter of bath composition, at a bath temperature of 20°–50°C while maintaining the pH of the bath at 9.5 – 10.5 by means of ammonium hydroxide, heat-treating the resultant metal film in an atmosphere which substantially prevents oxidation of the metal film at a pressure below 10 mm Hg and temperature above 230°C, with the proviso that $KT \geq 1000$ wherein K is the heat treatment temperature in °C and T is the time of the heat treatment in hours, and surface treating the heat-treated metal film in an atmosphere which causes oxidation of the metal film at a pressure above 10 mm Hg and temperature above 150°C, with the proviso that $KT \geq 200$ wherein K and T are as defined above.

2. A method according to claim 1, wherein the electroless plating bath further contains at least one member selected from the group consisting of 0.04 – 0.22 mol of sodium tartrate and 0.05 – 0.16 mol of sodium malate per liter of bath composition.

3. A method according to claim 1, wherein the heat treatment of the metal film is carried out in a vacuum or an inert gas.

4. A method according to claim 1, wherein the surface treatment of the metal film is carried out in air.

5. A cobalt-nickel alloy film resistor produced in accordance with claim 1.

* * * * *